(12) United States Patent
Liu

(10) Patent No.: US 11,864,375 B2
(45) Date of Patent: Jan. 2, 2024

(54) MEMORY AND METHOD FOR MANUFACTURING SAME

(71) Applicant: CHANGXIN MEMORY TECHNOLOGIES, INC., Anhui (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 231 days.

(21) Appl. No.: 17/372,893

(22) Filed: Jul. 12, 2021

(65) Prior Publication Data

US 2022/0052051 A1 Feb. 17, 2022

Related U.S. Application Data

(63) Continuation of application No. PCT/CN2020/138090, filed on Dec. 21, 2020.

(30) Foreign Application Priority Data

Aug. 11, 2020 (CN) .......................... 202010802218.4

(51) Int. Cl.
*H10B 12/00* (2023.01)
*H01L 29/06* (2006.01)

(52) U.S. Cl.
CPC ......... *H10B 12/34* (2023.02); *H01L 29/0649* (2013.01); *H10B 12/053* (2023.02)

(58) Field of Classification Search
CPC .. H10B 12/34; H10B 12/053; H10B 12/0387; H01L 29/4236
See application file for complete search history.

(56) References Cited

U.S. PATENT DOCUMENTS

| 9,583,615 | B2 | 2/2017 | Chen et al. |
| 10,381,345 | B2 | 8/2019 | Shin et al. |
| 10,529,847 | B2 | 1/2020 | Hsu |
| 2014/0264887 | A1* | 9/2014 | Barmak Vaziri ............... H01L 23/53209 257/770 |
| 2016/0240665 | A1 | 8/2016 | Chen et al. |

(Continued)

FOREIGN PATENT DOCUMENTS

| CN | 108364937 A | 8/2018 |
| CN | 110190054 A | 8/2019 |

(Continued)

*Primary Examiner* — Nelson Garces
(74) *Attorney, Agent, or Firm* — Cooper Legal Group, LLC

(57) ABSTRACT

A memory and a method for manufacturing the same are provided. The memory includes: a substrate including an isolation structure and an active area between adjacent isolation structures; a first gate structure, the first gate structure locates in a first groove of the isolation structure, includes a first gate filled in the first groove, and the first gate includes a first conductive layer filled at the bottom of the first groove and a second conductive layer, the second conductive layer locates above the first conductive layer, and the work function of the material of the first conductive layer is greater than that of the material of the second conductive layer; a second gate structure, located in the second groove of the active area, includes a second gate filled in the second groove, and the material of the second gate is the same as that of the second conductive layer.

19 Claims, 17 Drawing Sheets

(56) References Cited

U.S. PATENT DOCUMENTS

| | | | |
|---|---|---|---|
| 2018/0211952 A1 | 7/2018 | Shin et al. | |
| 2019/0103489 A1 | 4/2019 | Hsu | |
| 2020/0381436 A1* | 12/2020 | Noh | H01L 21/31155 |
| 2022/0045063 A1* | 2/2022 | Ryu | H01L 28/60 |

FOREIGN PATENT DOCUMENTS

| | | |
|---|---|---|
| CN | 110896053 A | 3/2020 |
| CN | 210156376 U | 3/2020 |
| CN | 210245492 U | 4/2020 |

\* cited by examiner

# MEMORY AND METHOD FOR MANUFACTURING SAME

CROSS-REFERENCE TO RELATED APPLICATION

The present application is a U.S. continuation application of International Application No. PCT/CN2020/138090, filed on Dec. 21, 2020, which claims priority to Chinese Patent Application No. 202010802218.4, filed on Aug. 11, 2020. International Application No. PCT/CN2020/138090 and Chinese Patent Application No. 202010802218.4 are incorporated herein by reference in their entireties.

TECHNICAL FIELD

The disclosure relates to the field of semiconductors, in particular to a memory and a method for manufacturing the same.

BACKGROUND

The memory is a memory component for storing programs and various data information, and can be classified into a read-only memory and a random access memory according to the types of the memory used. The memory typically includes a capacitor and a transistor connected with the capacitor. The capacitor is configured to store a charge which representative of the stored information and the transistor is a switch for controlling the inflow and discharge of the charge of the capacitor. The transistor has a source, a drain, and a gate, and the gate is connected to the word line.

However, with the increasing miniaturization of process nodes, the problem of memory signal interference becomes increasingly serious, and how to solve this problem has become an important issue of memory process optimization.

SUMMARY

The disclosure provides a memory and a method for manufacturing the same, which facilitate the reduction of signal interference between active areas on both sides of an isolation structure.

To address the above problem, the disclosure provides a memory including: a substrate, the substrate includes an isolation structure and an active area between adjacent isolation structures; a first gate structure, the first gate structure locates in a first groove of the isolation structure, and includes a first gate filled in the first groove, and the first gate includes a first conductive layer filled at the bottom of the first groove and a second conductive layer located above the first conductive layer, and the work function of the material of the first conductive layer is greater than that of the material of the second conductive layer; a second gate structure, the second gate structure locates in a second groove of the active area, and includes a second gate filled in the second groove, and a material of the second gate is the same as that of the second conductive layer.

Correspondingly, the disclosure further provides a method for manufacturing a memory, the method includes following acts. A substrate is provided. The substrate includes an isolation structure and an active area between adjacent isolation structures. An etching process is performed to form a first groove of the isolation structure and a second groove of the active area. A first deposition process is performed to form a first conductive layer filled at the bottom of the first groove. A second deposition process is performed to form a second conductive layer filled above the first conductive layer and in the second groove. The work function of the first conductive layer is greater than that of the second conductive layer. The first conductive layer and the second conductive layer filled in the first groove form a first gate. The second conductive layer filled in the second groove forms a second gate.

BRIEF DESCRIPTION OF THE DRAWINGS

One or more examples are illustrated by the figures of the appended drawings, which are not to be construed as a limitation of the examples, and elements in the drawings have the same reference numerals are represented as similar elements. Unless otherwise indicated, the figures in the drawings do not constitute a limitation in scale.

DETAILED DESCRIPTION

Figure 1:
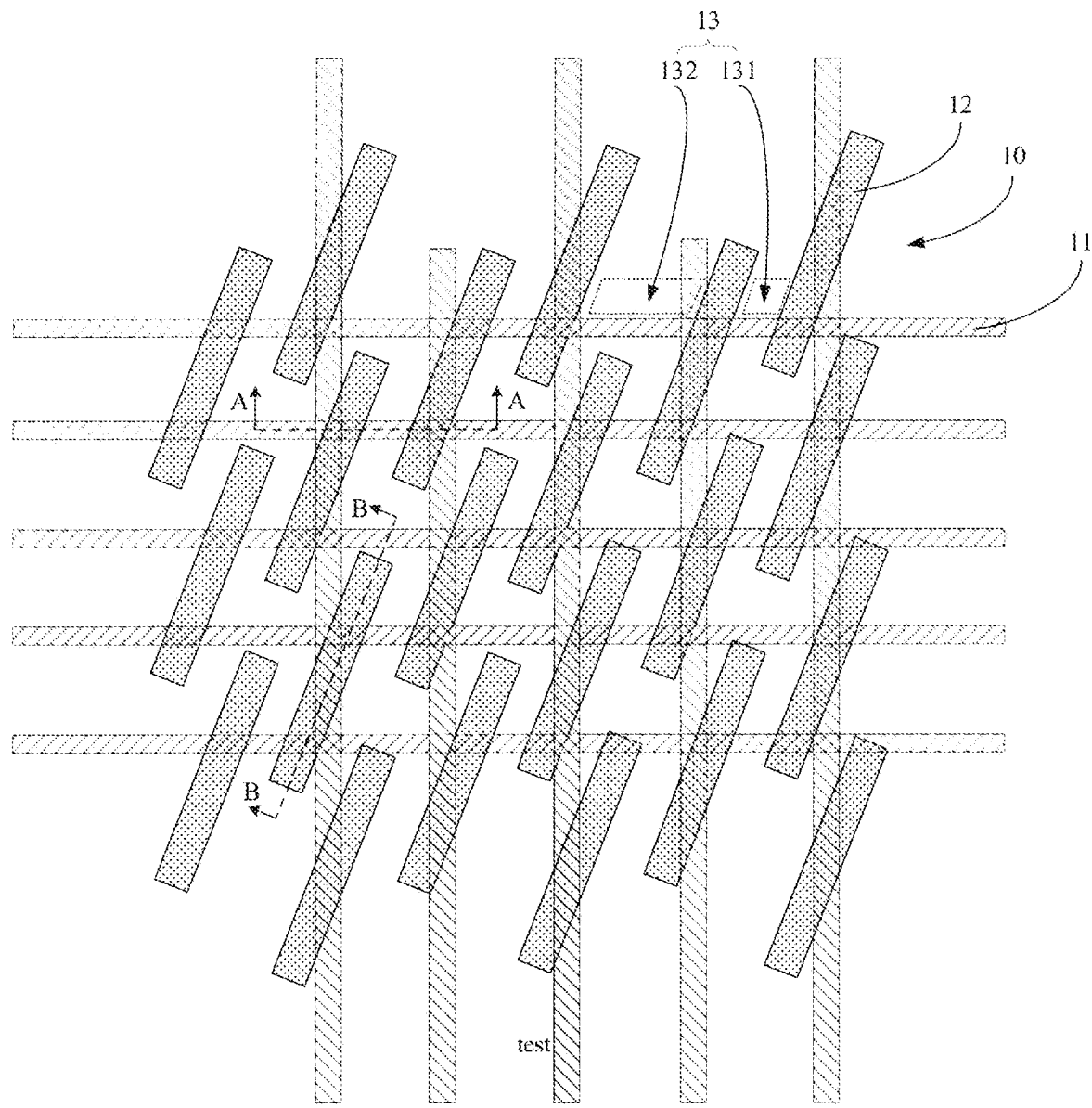
FIGS. 1 to 3 are schematic structural diagrams of a memory.
Figure 2:
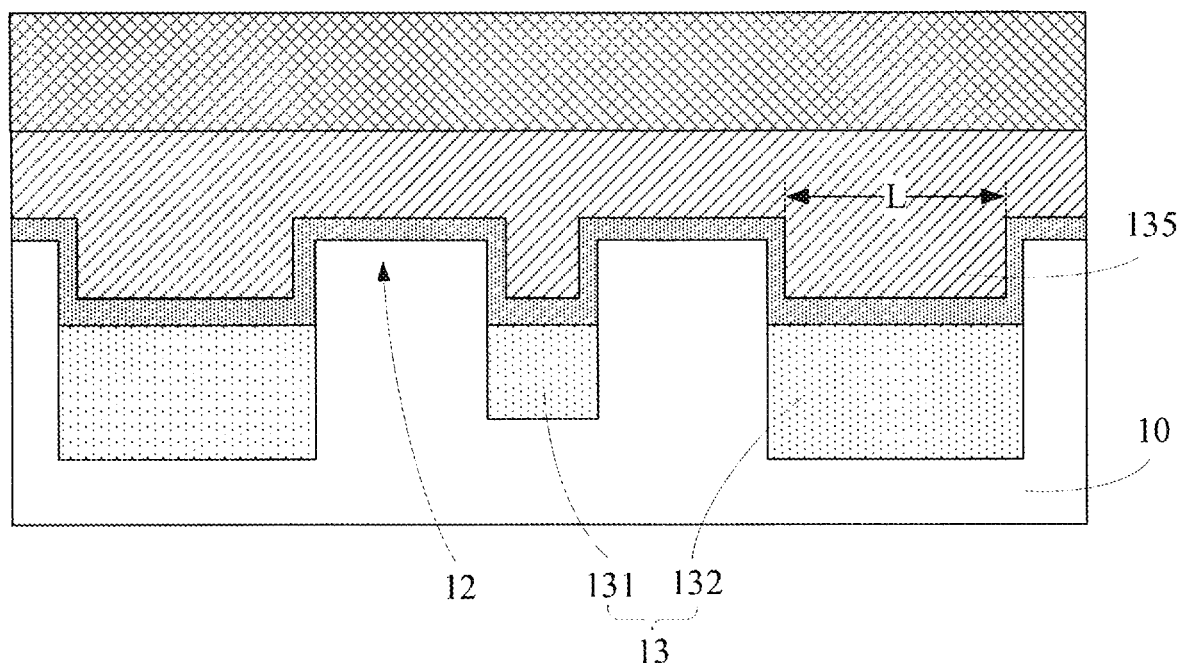
Figure 3:
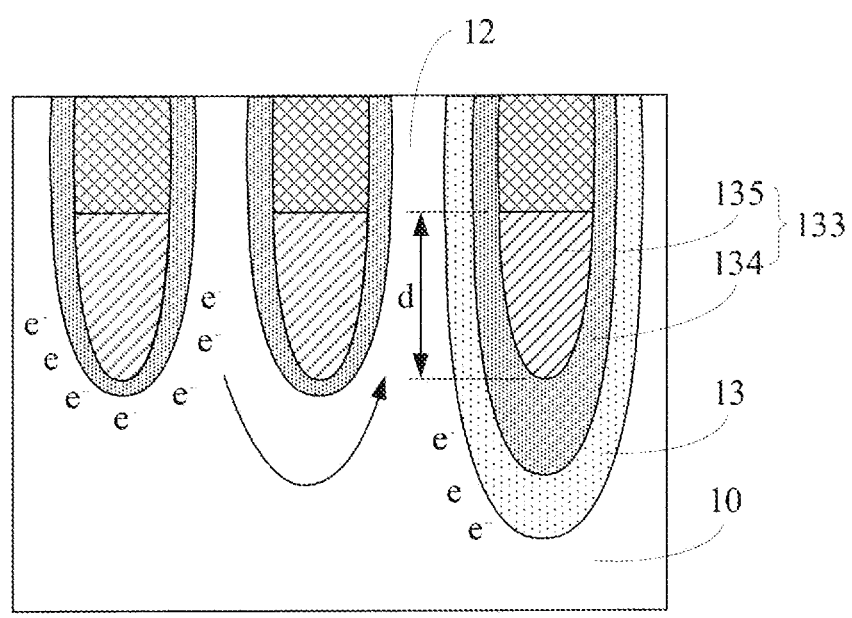

Referring to FIG. 1, a memory includes an active area 12 and an isolation structure 13 located between adjacent active areas 12; and bit lines are located above the active area 12 and the isolation structure 13, and word lines 11 are located in the active area 12 and the isolation structure 13. FIG. 2 is a schematic cross-sectional diagram in the first cross-sectional direction of the memory shown in FIG. 1. FIG. 3 is a cross-sectional diagram in the second cross-sectional direction of the memory shown in FIG. 1.

As the word line 11 is located in both the active area 12 and the isolation structure 13, in the process of etching to form the word line 11, the gate structure 133 is also formed in the isolation structure 13 besides that the gate structure 133 formed in the active area 12. The gate structure 133 consists of the gate 135 and the gate dielectric layer 134.

As the gate structure 133 is provided in the isolation structure 13, when an operating voltage is applied to the word line 11, the gate 135 in the isolation structure 13 actuates electrons in the active areas 12 located at both sides of the isolation structure 13, and the actuated electrons will gather in the channel region located below the isolation structure 13, thereby forming a channel. The electrons can transition between adjacent active areas 12 through the channel, thereby causing signal interference. The number of actuated electrons is associated with the threshold voltage of the gate structure 133. Under the same operating voltage, the higher the threshold voltage is, the less electrons actuated by the gate 135.

The value of the threshold voltage is associated with the width L of the gate 135 in the first cross-sectional direction AA. The greater the width L is, the larger the electric field of the gate 135 is at an operating voltage, and the less the threshold voltage is; In addition, the threshold voltage is also related to the depth d of the gate 135 in the substrate 10. The greater the depth d is, the stronger the electric field the gate 135 has in a working voltage, and thus the threshold voltage is lower.

According to the width L in the first cross-sectional direction AA, the isolation structure 13 may be divided into two kinds, i.e., the first isolation structure 131 and the second isolation structure 132. The width L of the first isolation structure 131 is less than the width L of the second isolation structure 132. As the width L of the second isolation structure 132 is greater, the intensity of electric field of the gate 135 in the second isolation structure 132 is relatively high, and the threshold voltage is relatively low, so that the electrons in the active area 12 located at both sides of the second isolation structure 132 are more likely to be actuated to transition, thereby causing signal interference.

On the contrary, as the width L of the first isolation structure 131 is relatively narrow, the intensity of electric field of the gate 135 in the first isolation structure 131 is relatively low, and the threshold voltage is relatively high, so that the electrons in the active area 12 located at both sides of the first isolation structure 131 are not likely to be actuated to transition, and thus signal interference problem is relatively unserious.

In order to solve the above problem, the disclosure provides a memory and a method for manufacturing the same. By providing a first conductive layer located at the bottom of a first groove in addition to a second conductive layer, the first gate structure has a relatively high threshold voltage and a second gate structure has a relatively low threshold voltage. Under the condition that the operating voltage applied to the first gate remains unchanged, the threshold voltage of the first gate structure is relatively high, and the number of actuated electrons is less, and the number of electrons gathered in a channel region below the isolation structure is less, so that it is difficult to form a channel. In this way, it is difficult for the electrons to transition from one active area to another through the channel region, thereby reducing signal interference between the active areas at both sides of the isolation structure.

In order to make the purposes, technical solutions, and advantages of the examples of the disclosure clearer, each example of the disclosure will be described in detail with reference to the appended drawings. However, it will be appreciated by those skilled in the art that in various examples of the disclosure, numerous technical details are set forth in order to enable the reader to better understand the disclosure, but the technical solution of disclosure can also be achieved without these technical details and various changes and modifications based on the following examples.

FIGS. 4 to 17 are schematic cross-sectional structures corresponding to each step of a method for manufacturing a memory according to an example of the disclosure. For ease of understanding, schematic cross-sectional structures of the first cross-sectional direction AA and the second cross-sectional direction BB are provided for each of manufacturing steps.

Figure 4:
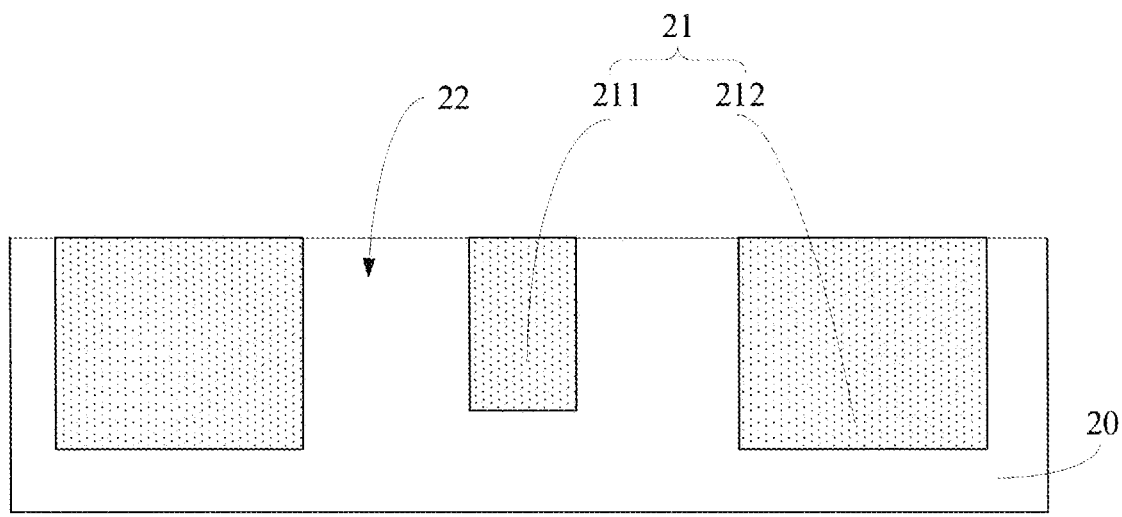
FIGS. 4 to 17 are schematic cross-sectional structure diagrams corresponding to each step of a method for manufacturing a memory according to an example of the disclosure.
Figure 5:
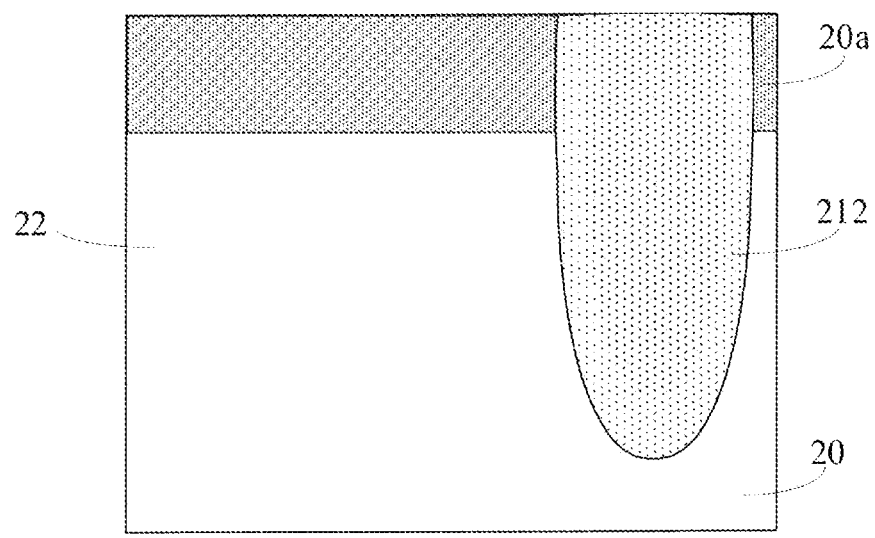

Referring to FIGS. 4 and 5, a substrate 20 is provided. The substrate 20 includes an isolation structure 21 and an active area 22 located between adjacent isolation structures 21.

In this example, in the first cross-sectional direction AA, the isolation structure 21 includes a first isolation structure 211 and a second isolation structure 212 with different widths. The width of the second isolation structure 212 is greater than that of the first isolation structure 211. The depth of the second isolation structure 212 in the substrate 20 is greater than that of the first isolation structure 211 in the substrate 20 due to an etch loading effect.

"Etching loading effect" means that under the same etching process, the depth of the groove formed by etching is related to the width of the opening of at the top of the groove. The wider the opening at the top is, the more plasma gas acting on the etching is, so that the depth of the groove is deeper.

In this example, a dielectric layer 20a is further provided at the top of the substrate 20, and can be used to protect the substrate 20 or to support other structures. For concision of illustration, the dielectric layer 20a is not shown in a schematic cross-sectional structure diagram in the first cross-sectional direction AA.

Figure 6:
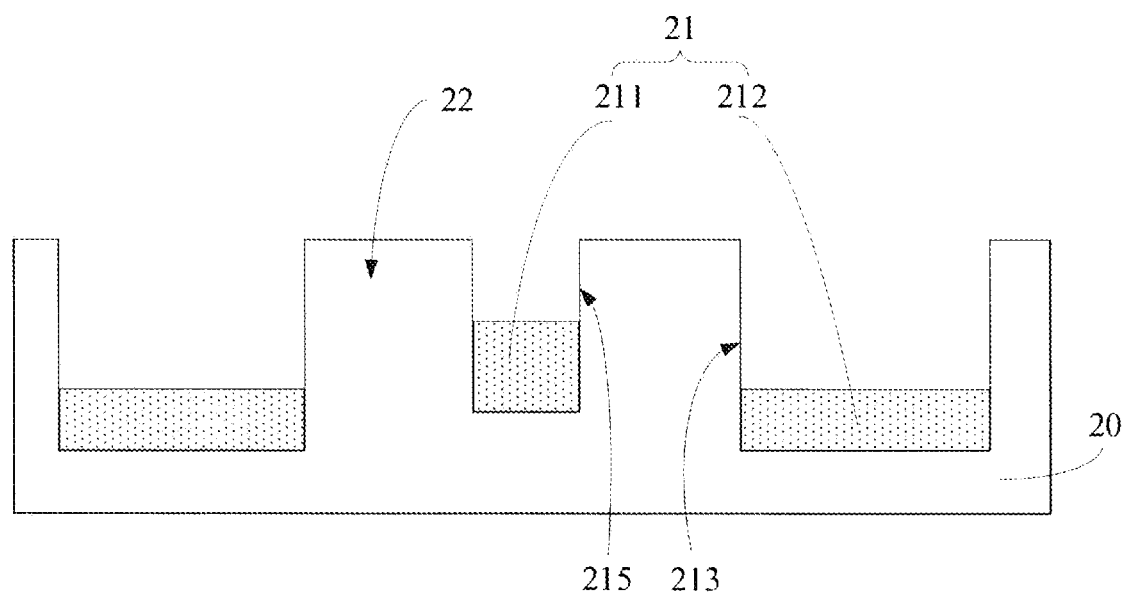
Figure 7:
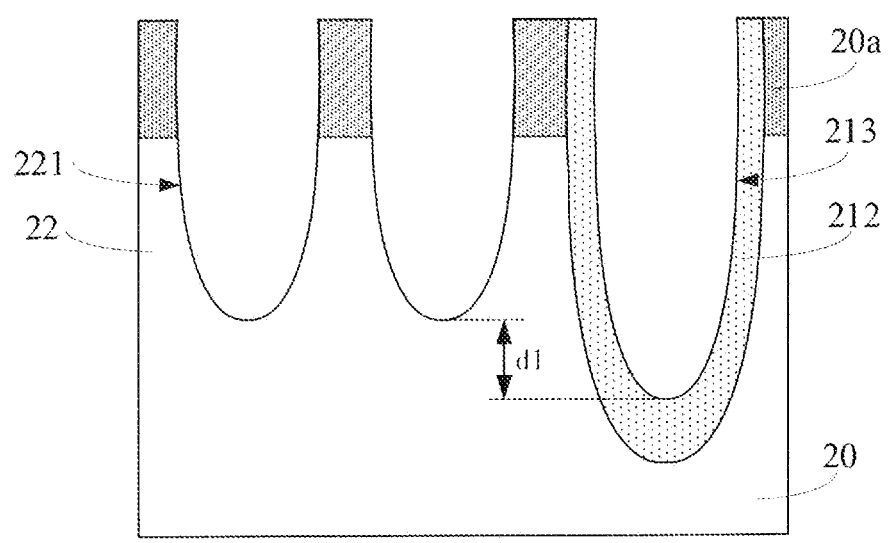

Referring to FIGS. 6 and 7, an etching process is performed to form a first groove 213 in the isolation structure 21 and a second groove 221 in the active area 22.

In this example, the depth of the first groove 213 in the substrate 20 is greater than that of the second groove 221 in the substrate 20, so that a thicker gate in the direction perpendicular to the surface of the substrate 20 can be formed by subsequent filling, thereby reducing the resistance of the word line in the second isolation structure 212. In other examples, the depth of the first groove in the substrate is equal to or less than that of the second groove in the substrate.

In this example, with the depth of the first groove 213 being greater than that of the second groove 221, it is also advantageous for the first conductive layer subsequently filled at the bottom of the first groove 213 to be staggered from the second gate subsequently filled in the second groove 221 in the direction perpendicular to the surface of the substrate 20, so that the presence of the first conductive layer does not affect the performance of the second gate.

The depth of the first groove 213 in the substrate 20 is associated with the resistance of the first gate subsequently formed in the first groove 213 and the threshold voltage of the first gate structure. Specifically, the first gate structure includes a first gate and a first gate dielectric layer. Where the thickness of the first gate dielectric layer is same, the deeper the depth of the first groove 213 is, the larger the cross-sectional area of the first gate subsequently formed is in the direction perpendicular to the substrate 20, so that the resistance of the first gate is less in the extending direction of the word line. In addition, where the same conductive material is filled, the deeper the depth of the first groove 213 is, the lager the size of the first gate is, the greater the intensity of the electric field of the first gate is, so that the threshold voltage of the first gate structure is lower.

In this example, the first groove 213 has a first depth in the substrate 20, and the second groove 221 has a second depth in the substrate 20. There is a first depth difference between the first depth and the second depth. The first depth difference d1 is from 10% to 50%, for example, 20%, 30% or 40% of the depth of the first groove 213. When the first depth difference d1 is too small, it is not advantageous to reduce the resistance of the word line in the second isolation structure 212, and it is prone for the first conductive layer subsequently formed to overlap with the front projection of the second gate filled in the second groove 221 in the direction parallel to the surface of the substrate, thereby affecting the performance of the second gate. When the first depth difference d1 is too large, it is prone to cause etching defects due to the overlarge width-depth ratio.

In this example, in the etching process, a third groove 215 is formed in the first isolation structure 211, and a first groove 213 is formed in the second isolation structure 212. The width of the opening of the third groove 215 is less than the width of the opening of the first groove 213 in the direction parallel to the surface of the substrate 20. The depth of the third groove 215 is less than that of the first groove 213 due to the etch loading effect. As the width of the opening of the third groove 215 is less than that of the first groove 213, and the depth of the third groove 215 is less than that of the first groove 213, under the same thickness of the gate dielectric layers and the same conductive material of the gate, the threshold voltage of the gate structure in the third groove 215 is lower than that of the gate structure in the first groove 213, so that electrons of the active areas 22 at both sides of the second isolation structure 212 are prone to be actuated to gather in the channel region below the second isolation structure 212, thereby causing electronic transitions and signal interference.

As an illustrative example, the gate in the second isolation structure 212 is adjusted to increase the gate threshold voltage, that is, the gate structure in the second isolation structure 212 is different from that in the first isolation structure 211, and only the first conductive layer is formed subsequently in the second isolation structure 212. In fact, the first conductive layer may also be filled in the third groove 215. In other words, the material of the gate structure in the third groove 215 is the same as that of the gate structure in the first groove 213.

In this example, the gate structure in the first groove 213 is referred to as a first gate structure, the gate structure in the active area 22 is referred to as a second gate structure, and the gate structure in the third groove 215 is referred to as a third gate structure. The material of the third gate structure is the same as that of the second gate structure.

Figure 8:
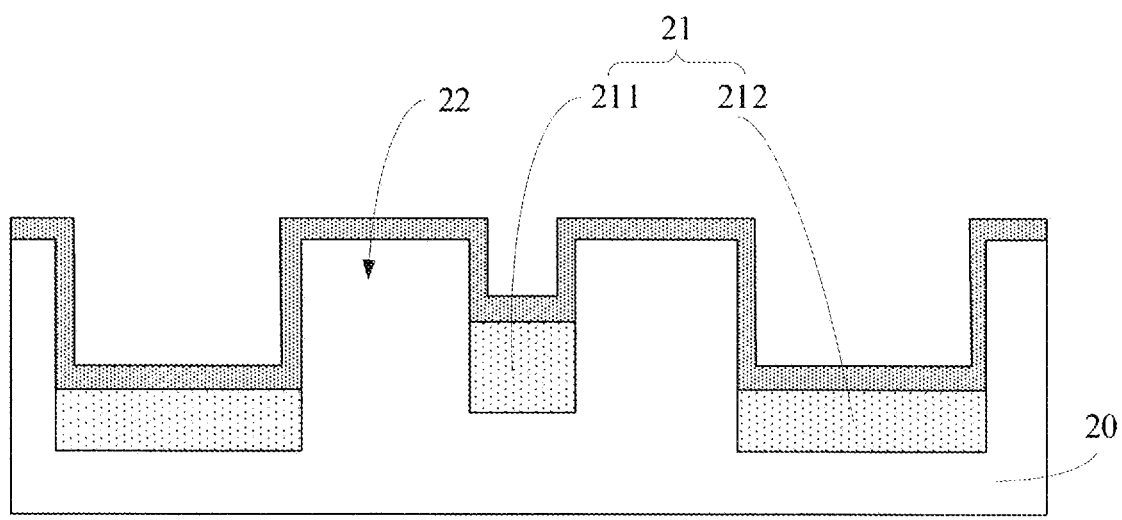
Figure 9:
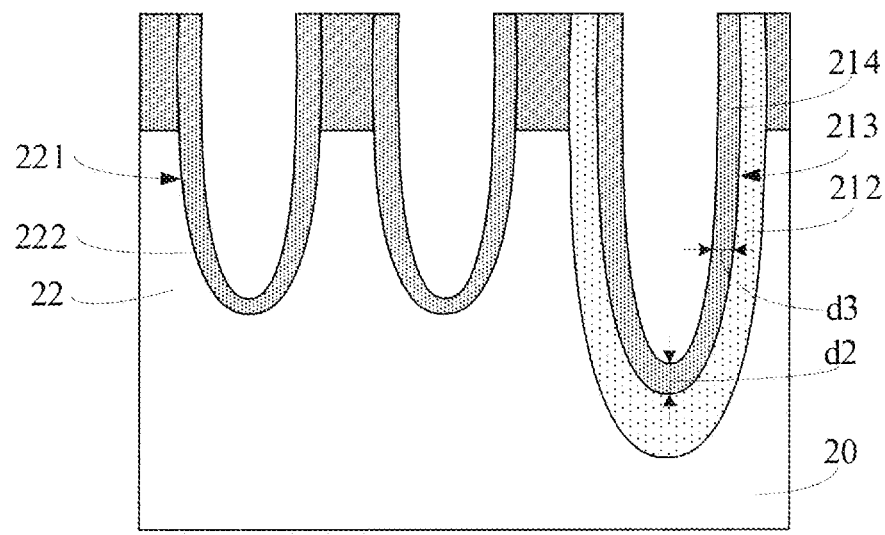
Figure 10:
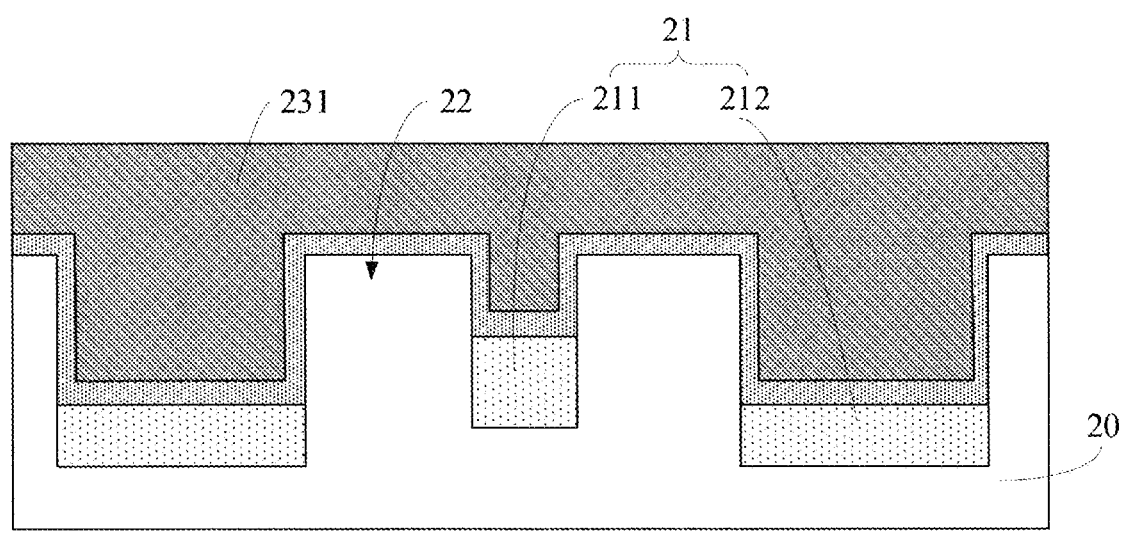
Figure 11:
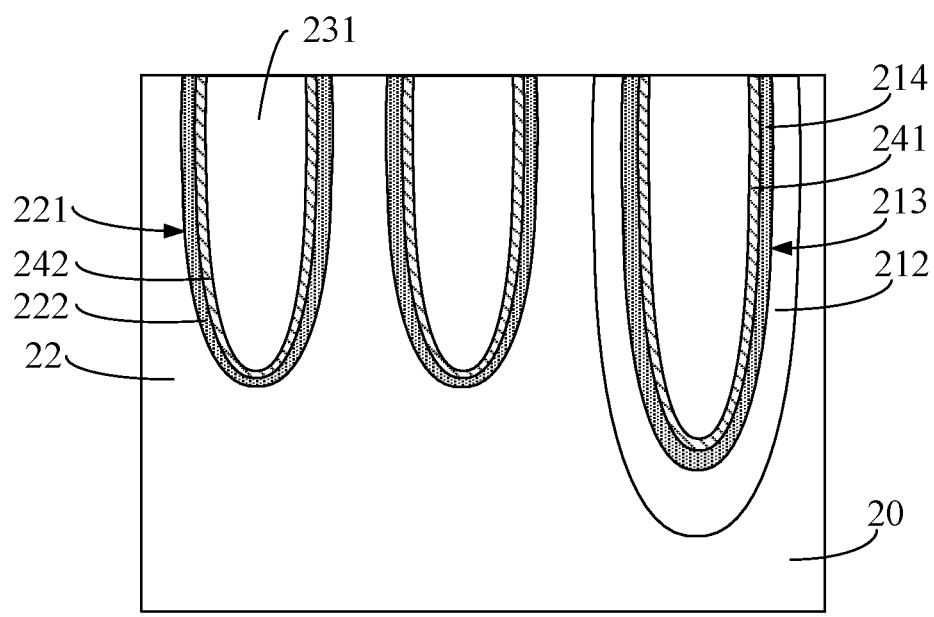
Figure 12:
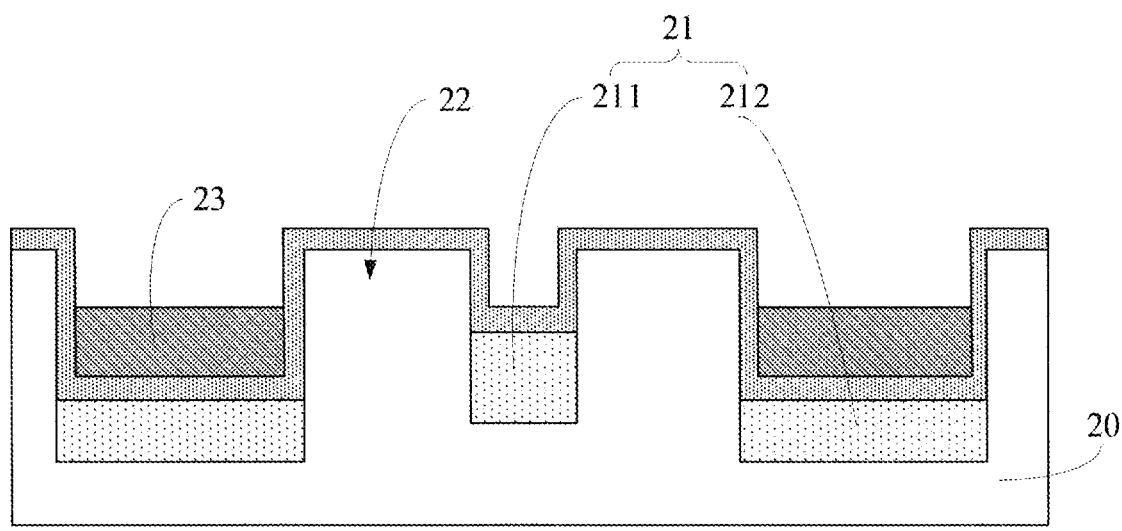
Figure 13:
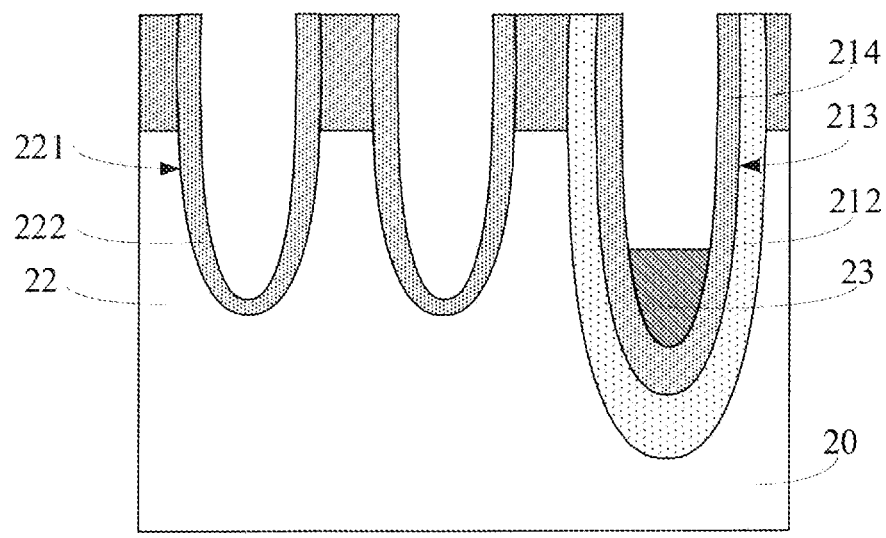

Referring to FIGS. 8 and 9, a first gate dielectric layer 214 covering the bottom surface and sidewalls of the first groove 213 and a second gate dielectric layer 222 covering the bottom surface and sidewalls of the second groove 221 are formed.

In this example, in the same deposition process, the first gate dielectric layer 214 and the second gate dielectric layer 222 are formed. The material of the first gate dielectric layer 214 is the same as that of the second gate dielectric layer 222. In addition, the first gate dielectric layer 214 is also located above the active area 22.

The thickness of the first gate dielectric layer 214 is associated with the threshold voltage of the first gate structure and the resistance of the word line in the second isolation structure 212. Specifically, the thicker the first gate dielectric layer 214 is, the greater the isolation effect of the first gate dielectric layer 214 on the electric field of the first gate is. In addition, the first gate dielectric layer 214 is relatively thick, the reserved space of the first gate is less, the size of the first gate is smaller, the intensity of electric field of the first gate is less, and the threshold voltage of the first gate structure is higher. In addition, the less the size of the first gate is, the less the resistance of the word line in the second isolation structure 212 is.

To reach both a higher threshold voltage of the first gate structure and a lower resistance of the word lines in the second isolation structure 212, the first gate dielectric layer 214 can be provided so that its first thickness d2 in the direction perpendicular to the surface of the substrate 20 is thicker than its second thickness d3 in the direction parallel to the surface of the substrate 20.

In this example, referring to FIGS. 10 to 13, a first deposition process is performed to form a first conductive layer 23 filled at the bottom of the first groove 213.

The first deposition process includes the following acts. A first conductive film 231 filled up in the first groove 213 and the second groove 221 is formed. The first conductive film 231 is etched to form a first conductive layer 23 filled only at the bottom of the first groove 213.

In this example, the work function of the material of the first conductive layer 23 is greater than that of the material of the second conductive layer subsequently formed. In this way, it is advantageous to increase the work function of the first gate in the second isolation structure 212, thereby increasing the threshold voltage of the first gate structure.

The higher the threshold voltage of the first gate structure is, the more difficult it is to form a channel under the same operating voltage, that is, the more difficult it is for electrons to transition from the active area 22 on one side of the second isolation structure 212 towards the other active area 22 on the other side of the second isolation structure 212. By doing so, it is advantageous to reduce signal interference between the active areas 22 at two adjacent sides of the second isolation structure 212.

In this example, the material of the first conductive layer 23 includes at least one of titanium nitride, tungsten, nickel, or cobalt. The crystal orientations of the tungsten of the first conductive layer 23 include [100] and [110]. It is noted that in the case that the material of the second conductive layer subsequently formed is also tungsten, the crystal orientation of the tungsten of the second conductive layer includes [111], [113] or [116], that is, the work function of the tungsten of the second conductive layer is less than that of the tungsten of the first conductive layer 23.

In this example, in the direction perpendicular to the surface of the substrate 20, the thickness of the first conductive layer 23 is from 1 nm to 5 nm, for example, 2 nm, 3 nm, or 4 nm. In the case that the thickness of the first conductive layer 23 is too thin, the increase of the threshold voltage is less, so that the suppression of signal interference is weaker. In the case that thickness of the first conductive layer 23 is too thick, the performance of the second gate structure in the active area 22 may be affected.

In this example, before forming the first conductive layer 23, a first blocking layer 241 covering the bottom surface and sidewalls of the first gate dielectric layer 214 and a second blocking layer 242 covering the bottom surface and sidewalls of the second gate dielectric layer 222 are also formed. The material of the first blocking layer may be the same as that of the second blocking layer. The blocking layer is configured to block the migration of metal ions in the gate towards the gate dielectric layer and the substrate 20. The first blocking layer and the second blocking layer may be formed in the same process.

Figure 14:
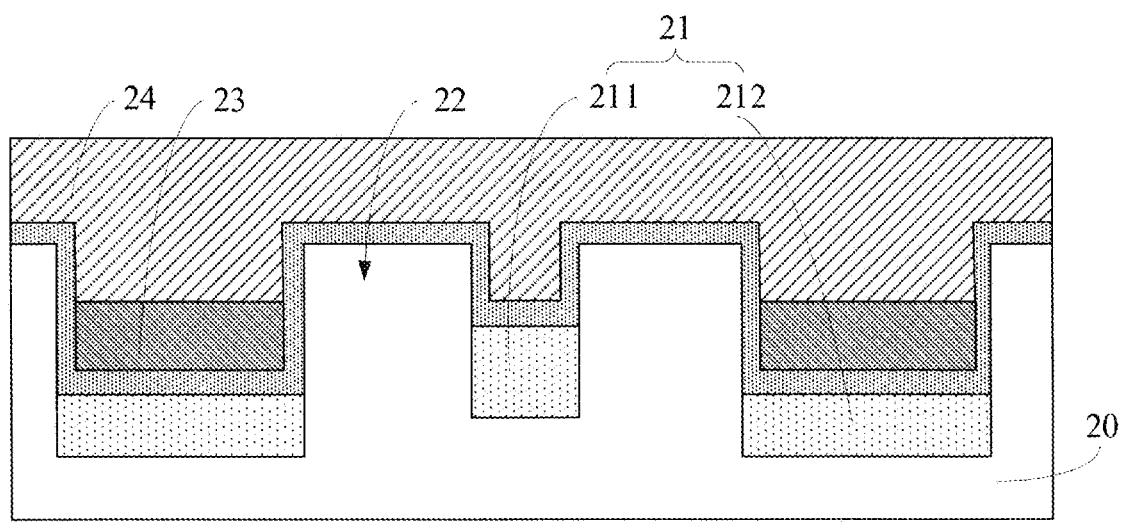
Figure 15:
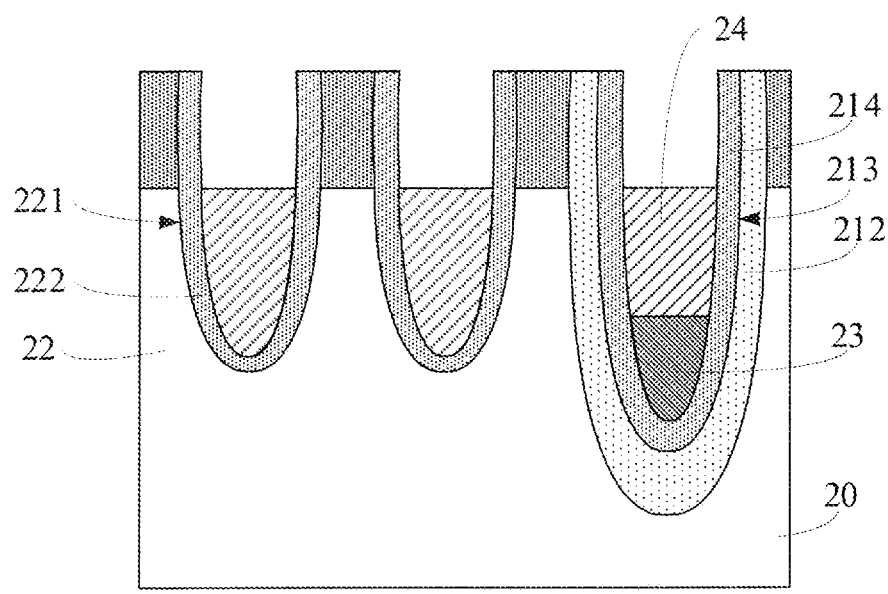

Referring to FIGS. 14 and 15, a second deposition process is performed to form a second conductive layer 24. The second conductive layer fills on the first conductive layer 23 and in the second groove 221.

In this example, the first conductive layer 23 and the second conductive layer 24 filled in the first groove 213 constitute a first gate; and the first gate and the first gate dielectric layer 214 constitute a first gate structure. The second conductive layer 24 filled in the second groove 221 constitutes a second gate; and the second gate and the second gate dielectric layer 222 constitute a second gate structure.

Figure 16:
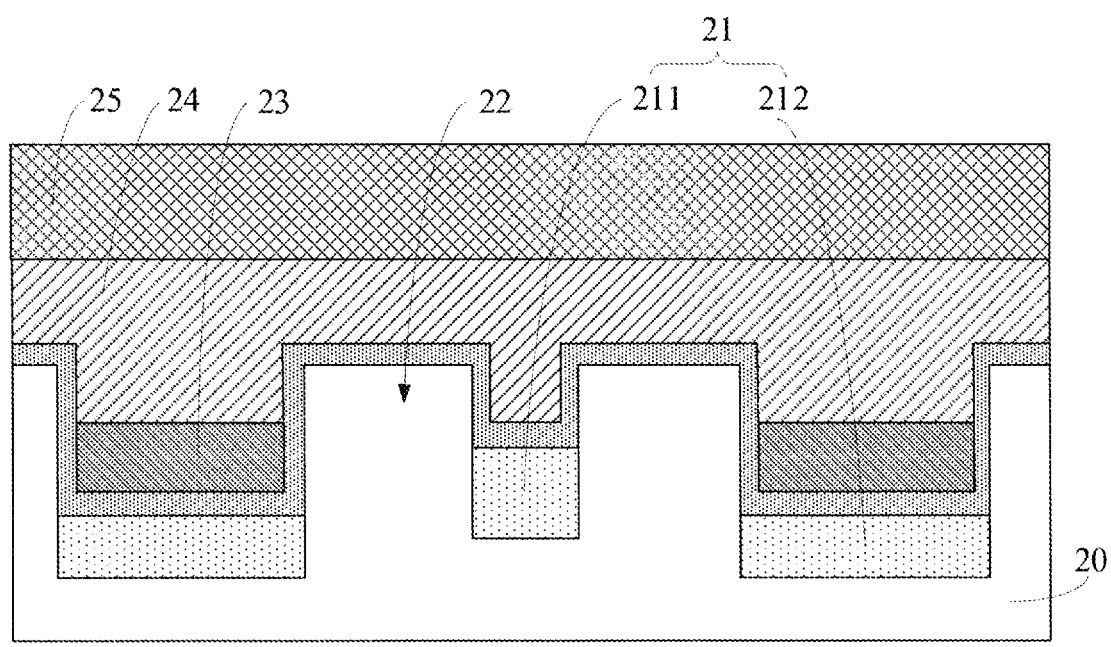
Figure 17:
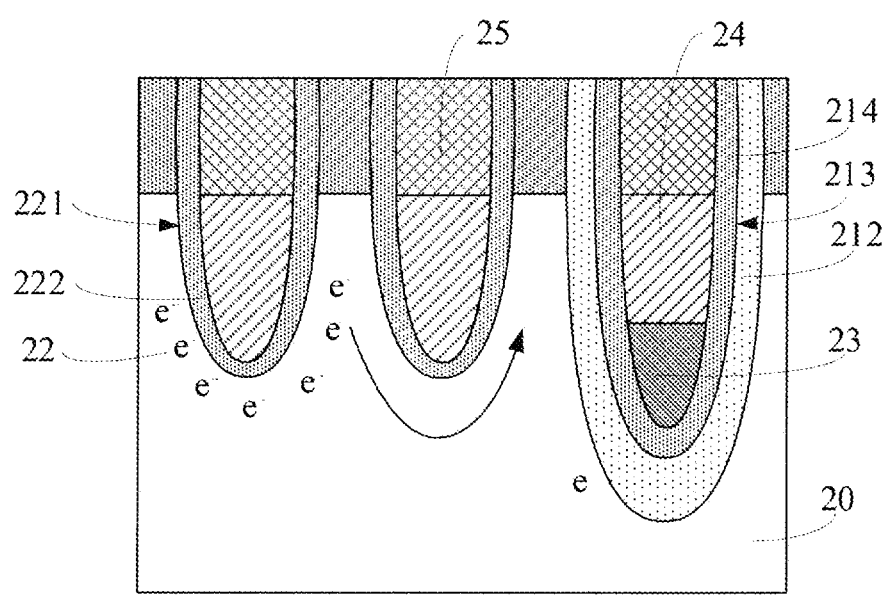

Referring to FIGS. 16 and 17, an isolation layer 25 is formed.

The isolation layer 25 is configured for electrical isolation. The material of the isolation layer 25 includes silicon nitride.

In this example, as compared to the second gate, the first gate further has a first conductive layer with a greater work function of material, so that the first gate structure has a higher threshold voltage than the second gate structure. In the case that the operating voltage applied to the first gate remains unchanged, as the threshold voltage of the first gate structure increases, the number of actuated electrons decreases, then the number of electrons gathered in the channel region below the isolation structure decreases, so that it is difficult to form the channel. In this way, it is difficult for the electrons to transition from one active area to another through the channel region, thereby reducing signal interference between the active areas at both sides of the isolation structure.

Correspondingly, an example of the disclosure further provides a memory which may be formed by the method for manufacturing a memory described above.

Referring to FIGS. 16 and 17, the memory includes: a substrate 20 including an isolation structure 21 and an active area 22 located between adjacent isolation structures 21; a first gate structure (not shown) located in a first groove 213 in the isolation structure 21, in which the first gate structure includes a first gate (not shown) filled in the first groove 213, and the first gate includes a first conductive layer 23 filled at the bottom of the first groove 213 and a second conductive layer 24 located above the first conductive layer 23, and the work function of the material of the first conductive layer 23 is greater than that of the material of the second conductive layer 24; a second gate structure (not shown), in which the second gate structure is located in the second groove 221 of the active area 22, and the second gate structure includes a second gate (not shown) filled in the second groove 221, and the material of the second gate is the same as that of the second conductive layer.

In this example, the first gate structure includes a first gate dielectric layer 214 covering the bottom surface and sidewalls of the first groove 213, and the second gate structure includes a second gate dielectric layer 222 covering the bottom surface and sidewalls of the second groove 221. The material of the first gate dielectric layer 214 is the same as that of the second gate dielectric layer 222.

In this example, the depth of the first gate in the substrate 20 is greater than that of the second gate in the substrate 20.

In this example, the isolation structure 21 further includes a third groove (not shown). In the direction parallel to the surface of the substrate 20, the width of the opening the first groove 213 is greater than that of the third groove. The third groove is filled with the third gate structure whose material is the same as that of the second gate structure.

In this example, in the direction perpendicular to the surface of the substrate 20, the top surface of the first conductive layer 23 is lower than or flush with the bottom surface of the second gate.

In this example, the first gate structure further includes a first blocking layer located between the first gate and the first gate dielectric layer 214, and the second gate structure further includes a second blocking layer located between the second gate and the second gate dielectric layer 222. The material of the first blocking layer is the same as that of the second blocking layer.

In this example, in the direction perpendicular to the surface of the substrate 20, the thickness of the first conductive layer 23 is from 1 nm to 5 nm, for example, 2 nm, 3 nm, or 4 nm.

In this example, the material of the first conductive layer 23 includes at least one of titanium nitride, tungsten, nickel or cobalt. The crystal orientations of the tungsten of the first conductive layer 23 include [100] and [110]. It is noted that in the case that the material of the second conductive layer subsequently formed is also tungsten, and the crystal orientation of the tungsten of the second conductive layer includes [111], [113] or [116], that is, the work function of the tungsten of the second conductive layer is less than that of the tungsten of the first conductive layer 23.

In this example, as compared to the second gate, the first gate further has a first conductive layer with a greater work function of material, so that the first gate structure has a higher threshold voltage than the second gate structure. In the case that the operating voltage applied to the first gate remains unchanged, the threshold voltage of the first gate structure increases, the number of electrons capable of being actuated by the operating voltage decreases, and the number of electrons gathered in the channel region below the isolation structure decreases, so that it is more difficult to form the channel. In this way, it is difficult for electrons to transition from one active area to another through the channel region, thereby reducing signal interference between the active areas at both sides of the second isolation structure.

It will be appreciated by those of ordinary skill in the art that the above-described examples are specific examples for achieving the disclosure, and that various modifications may be made in form and detail in practical applications without departing from the spirit and scope of the disclosure. Any person skilled in the art may make respective changes and modifications without departing from the spirit and scope of the disclosure, and therefore the scope of protection of the disclosure should be limited by the scope defined by the claims.

The invention claimed is:

1. A memory, comprising,
a substrate, wherein the substrate comprises an isolation structure and an active area between the isolation structure and an adjacent second isolation structure;
a first gate structure, wherein the first gate structure is located in a first groove of the isolation structure and comprises a first gate filled in the first groove, the first gate comprises a first conductive layer filled at a bottom of the first groove and a second conductive layer located above the first conductive layer, and a work function of a material of the first conductive layer is greater than a work function of a material of the second conductive layer;
a second gate structure, wherein the second gate structure is located in a second groove of the active area and comprises a second gate filled in the second groove, a material of the second gate is same as the material of the second conductive layer, and the second conductive layer filled in the second groove is the second gate; and
a third groove, the third groove having an opening width less than an opening width of the first groove in a direction parallel to a surface of the substrate and being filled with a third gate structure,
wherein a material of the first gate structure is different from a material of the second gate structure, and a material of the third gate structure is same as the material of the second gate structure.

2. The memory of claim 1, wherein the first gate structure further comprises a first gate dielectric layer covering a bottom surface and sidewalls of the first groove, the second gate structure further comprises a second gate dielectric layer covering a bottom surface and sidewalls of the second groove, and a material of the first gate dielectric layer is same as a material of the second gate dielectric layer.

3. The memory of claim 2, wherein a thickness of the first gate dielectric layer in a direction perpendicular to a surface of the substrate is greater than a thickness in a direction parallel to the surface of the substrate.

4. The memory of claim 2, wherein the first gate structure further comprises a first blocking layer covering a surface of the first gate dielectric layer, and the first blocking layer is configured to block a migration of metal ions in the first gate towards the first gate dielectric layer.

5. The memory of claim 4, wherein the second gate structure further comprises a second blocking layer covering a surface of the second gate dielectric layer, and the second blocking layer is configured to block a migration of metal ions in the second gate towards the second gate dielectric layer.

6. The memory of claim 5, wherein a material of the first blocking layer is same as a material of the second blocking layer.

7. The memory of claim 1, wherein a depth of the first gate in the substrate is greater than a depth of the second gate in the substrate.

8. The memory of claim 7, wherein the first groove has a first depth in the substrate, the second groove has a second depth in the substrate, and a difference between the first depth and the second depth is from 10% to 50% of the first depth.

9. The memory of claim 1 wherein in a direction perpendicular to a surface of the substrate, a top surface of the first conductive layer is lower than or flush with a bottom surface of the second gate.

10. The memory of claim 1, wherein in a direction perpendicular to a surface of the substrate, a thickness of the first conductive layer is 1 nm to 5 nm.

11. The memory of claim 1, wherein the material of the first conductive layer comprises at least one of titanium nitride, tungsten, nickel or cobalt.

12. The memory of claim 11, wherein crystal orientations of the tungsten of the first conductive layer comprise [100] and [110].

13. The memory of claim 12, wherein the material of the second conductive layer comprises tungsten, and a crystal orientation of the tungsten of the second conductive layer comprises [111], [113], or [116].

14. A method for manufacturing a memory, comprising,
providing a substrate, the substrate comprising an isolation structure and an active area, the isolation structure comprising a first isolation structure and a second isolation structure that are adjacent;
performing an etching process to form a first groove of the second isolation structure, a third groove of the first isolation structure, and a second groove of the active area, the third groove having an opening width less than an opening width of the first groove in a direction parallel to a surface of the substrate and being filled with a third gate structure;
performing a first deposition process to form a first conductive layer filled at a bottom of the first groove; and
performing a second deposition process to form a second conductive layer filled above the first conductive layer and in the third groove and the second groove, the first conductive layer having a work function greater than a work function of the second conductive layer, the first conductive layer and the second conductive layer filled in the first groove constituting a first gate structure, and the second conductive layer filled in the second groove constituting a second gate structure,
wherein a material of the first gate structure is different from a material of the second gate structure, and a material of the third gate structure is same as the material of the second gate structure.

15. The method of claim 14, further comprising: before performing the first deposition process, forming a first gate dielectric layer covering a bottom surface and sidewalls of the first groove and a second gate dielectric layer covering a bottom surface and sidewalls of the second groove and a bottom surface and sidewalls of the third groove, and a material of the first gate dielectric layer is same as a material of the second gate dielectric layer.

16. The method of claim 15, further comprising: before performing the first deposition process, forming a first blocking layer covering a surface of the first gate dielectric layer, the first blocking layer being configured to block a migration of metal ions in the first gate structure towards the first gate dielectric layer.

17. The method of claim 16, wherein the first blocking layer and a second blocking layer covering a surface of the second gate dielectric layer are formed in same process, and the second blocking layer is configured to block a migration of metal ions in the second gate structure towards the second gate dielectric layer.

18. The method of claim 14, wherein in the direction perpendicular to the surface of the substrate, a depth of the first groove of the isolation structure is greater than a depth of the second groove of the active area.

19. The memory of claim 1, wherein the first conductive layer is not present in the second groove.

* * * * *